US008869738B2

(12) United States Patent
Shin et al.

(10) Patent No.: US 8,869,738 B2
(45) Date of Patent: Oct. 28, 2014

(54) MASK FRAME ASSEMBLY FOR THIN FILM DEPOSITION AND THE MANUFACTURING METHOD THEREOF

(75) Inventors: Eui-Shin Shin, Yongin (KR); Jae-Seok Park, Yongin (KR); Young-Geun Cho, Yongin (KR); Woo-Dong Kim, Yongin (KR); Kyu-Bum Kim, Yongin (KR); Jeung-Woo Huh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 169 days.

(21) Appl. No.: 13/244,100

(22) Filed: Sep. 23, 2011

(65) Prior Publication Data
US 2012/0145076 A1 Jun. 14, 2012

(30) Foreign Application Priority Data

Dec. 14, 2010 (KR) ........................ 10-2010-0127858

(51) Int. Cl.
*B05C 11/11* (2006.01)
*B05D 5/00* (2006.01)
*G03F 1/00* (2012.01)

(52) U.S. Cl.
CPC ........................................ *G03F 1/00* (2013.01)
USPC .......................................... 118/504; 427/282

(58) Field of Classification Search
None
See application file for complete search history.

(56) References Cited

U.S. PATENT DOCUMENTS

| 6,589,382 | B2 * | 7/2003 | Clark et al. | 156/304.3 |
| 6,858,086 | B2 | 2/2005 | Kang | |
| 2002/0014465 | A1 * | 2/2002 | Chung | 211/126.1 |
| 2003/0221614 | A1 * | 12/2003 | Kang et al. | 118/504 |
| 2009/0242111 | A1 * | 10/2009 | Iri et al. | 156/256 |

FOREIGN PATENT DOCUMENTS

| EP | 1209522 A2 * | 5/2002 | G03F 1/14 |
| KR | 10-2003-0093959 A | 12/2003 | |
| KR | 10-2005-0019502 A | 3/2005 | |
| KR | 10-0647076 B1 | 11/2006 | |
| KR | 10-2007-0027300 A | 3/2007 | |
| KR | 10-2008-0058602 A | 6/2008 | |

* cited by examiner

*Primary Examiner* — Dah-Wei D Yuan
*Assistant Examiner* — Charles Capozzi
(74) *Attorney, Agent, or Firm* — Knobbe Martens Olson & Bear LLP

(57) ABSTRACT

A mask frame assembly using a plurality of stick-shaped split masks. The mask frame assembly includes a plurality of split masks, each of which includes a deposition pattern corresponding to a unit screen. Each of the split masks is formed of a plurality of partial masks to form the deposition pattern corresponding to a unit screen. Accordingly, the split masks accommodating a pattern corresponding to a large screen may be easily manufactured without an increase in the amount of etching errors.

9 Claims, 10 Drawing Sheets

MASK FRAME ASSEMBLY FOR THIN FILM DEPOSITION AND THE MANUFACTURING METHOD THEREOF

CROSS-REFERENCE TO RELATED PATENT APPLICATION

This application claims the benefit of Korean Patent Application No. 10-2010-0127858, filed on Dec. 14, 2010, in the Korean Intellectual Property Office, the disclosure of which is incorporated herein in its entirety by reference.

BACKGROUND

1. Field

The present disclosure relates to mask frame assemblies for deposition of thin films, and more particularly, to mask frame assemblies using split masks, and methods of manufacturing the mask frame assemblies.

2. Description of the Related Art

In general, among display devices, organic light-emitting display devices provide a wide viewing angle, an excellent contrast ratio, and a high response speed.

Organic light-emitting display devices realize colors based on the principle that holes and electrons injected from an anode and a cathode recombine in an emissive layer and emit light. Thus, organic light-emitting display devices have a stacked structure in which the emissive layer is inserted between the anode and the cathode. However, it is difficult to achieve high emission efficiency using this structure, and thus intermediate layers such as an electron injection layer, an electron transport layer, a hole transport layer, and a hole injection layer are selectively inserted between the electrodes and the emissive layer.

The electrodes and the intermediate layers such as the emissive layer of the organic light-emitting display devices may be formed using various methods, and one of these is a deposition method. In order to manufacture an organic light-emitting display device using a deposition method, a fine metal mask (FMM) having the same pattern as a pattern of a thin film that is to be formed on a substrate is aligned on the substrate, and a material used to form the thin films is deposited to form a thin film having a desired pattern.

However, if the FMM becomes too large, etching errors also increase during forming patterns. Thus, split masks are used. The split masks are formed of a various number of stick-shaped masks and attached to a frame. That is, a mask device for use in depositing a plurality of screens of organic light-emitting display devices on a mother substrate is used, whereas since it is difficult to cover the entire surface of the mother substrate using a single mask without any etching errors, several split masks in the form of sticks having a predetermined width are attached to the frame to form the mask device.

Recently, the screens of the organic light-emitting display devices become large, and the size of a unit screen to be deposited become larger than a single split mask. That is, a maximum width of a split mask which would be able to avoid an etching error is about 150 mm and deposition patterns corresponding to screens having 7 inches or smaller size may be formed using this split mask. However, to accommodate a deposition pattern corresponding, for example, to a 14-inch screen, the split mask needs to have a width of about 300 mm. When forming a split mask having a width of 300 mm or greater, etching errors increase.

The foregoing discussion in the background section is to provide general background information, and does not constitute an admission of prior art.

SUMMARY

One or more embodiments of the present invention provide mask frame assemblies capable of easily accommodating deposition patterns corresponding to large-surface screens without increasing etching errors when manufacturing split masks, and methods of manufacturing the mask frame assemblies.

According to an aspect of the present invention, there is provided a mask frame assembly for deposition of thin films, the mask frame assembly comprising: a frame having an opening portion therein; and a plurality of split masks each including a deposition pattern corresponding to a unit screen, wherein two end portions of each of the plurality of split masks are fixed to the frame and the deposition pattern is located in the opening portion, wherein each of the plurality of split masks comprises a plurality of partial masks coupled to form the deposition pattern corresponding to the unit screen.

The plurality of partial masks may comprise a first partial mask comprising a first partial pattern of the deposition pattern and a second partial mask comprising a second partial pattern of the deposition pattern, and sides of the first and second partial masks opposing each other are bonded to each other using an adhesive so as to bond the first and second partial masks.

The first partial pattern and the second partial pattern may have a uniform pattern pitch throughout the deposition pattern including a bonding portion of the first partial mask and the second partial mask.

The adhesive may be a UV-curing adhesive.

The UV-curing adhesive may be coated on upper and lower surfaces of the bonding portion and cured.

The sides of the bonding portions of the first partial mask and the second partial mask which form the bonding portion of the first and second partial masks may be parallel to each other.

The adhesive may be a thermosetting adhesive.

The thermosetting adhesive may be coated on sides of the bonding portion and cured.

The sides of the first partial mask and the second partial mask may be parallel to each other.

According to another aspect of the present invention, there is provided a method of manufacturing a mask frame assembly for deposition of thin films, the method comprising: providing a plurality of partial masks including partial patterns each of which comprises a portion of a deposition pattern corresponding to a unit screen; manufacturing a split mask by coupling the partial masks such that the partial patterns are connected to each other so as to form a deposition pattern corresponding to the unit screen; and fixing the split mask to a frame.

The partial masks may comprise a first partial mask having a first partial pattern and a second partial mask having a second partial pattern, wherein the first partial pattern and the second partial pattern have a uniform pattern pitch throughout the deposition pattern including a bonding portion of the first partial mask and the second partial mask.

The manufacturing of the split mask may comprise: arranging the first partial mask and the second partial mask such that sides of the first and second partial masks are located adjacent to each other with a predetermined distance; applying a UV-curing adhesive to the sides of the first and second partial masks; and curing the UV-curing adhesive by UV irradiation.

The applying and curing of the UV-curing adhesive may comprise: applying the UV-curing adhesive on an upper surface of the bonding portion of the first partial mask and the second partial mask and curing the UV-curing adhesive; and applying the UV-curing adhesive on a lower surface of the bonding portion of the first partial mask and the second partial mask and curing the UV-curing adhesive.

In the applying of the UV-curing adhesive, a vision camera may guide the coating by tracing the bonding portion of the first partial mask and the second partial mask, and an applying apparatus may follow the vision camera to apply the UV-curing adhesive.

The manufacturing of the split mask may comprise: applying a thermosetting adhesive on sides of the first partial mask and the second partial mask that are to be bonded to each other; adhering the sides of the first and second partial masks with the thermosetting adhesive to each other; and heating the thermosetting adhesive using a heating unit to cure the thermosetting adhesive.

The curing of the thermosetting adhesive may comprise: curing the thermosetting adhesive by heating a first surface of the bonding portion of the first partial mask and the second partial mask; and curing the thermosetting adhesive by heating a second surface of the bonding portion of the first partial mask and the second partial mask.

The curing of the thermosetting adhesive may comprise curing the thermosetting adhesive by heating first and second surfaces of the bonding portion of the first partial mask and the second partial mask at the same time.

The heating unit may comprise one of a heating roller that rotates in contact with the bonding portion to heat the thermosetting adhesive and a blower that blows hot air onto the thermosetting adhesive while not touching the bonding portion.

According to mask frame assemblies and the methods of manufacturing the mask frame assemblies, split masks accommodating patterns corresponding to large-surface screens may be easily manufactured without an increase in the amount of etching errors.

BRIEF DESCRIPTION OF THE DRAWINGS

The above and other features and advantages of the present invention will become more apparent by describing in embodiments thereof with reference to the attached drawings in which.

DETAILED DESCRIPTION OF EMBODIMENTS

Embodiments of the present invention will now be described more fully with reference to the accompanying drawings, in which embodiments of the invention are shown.

Figure 1:
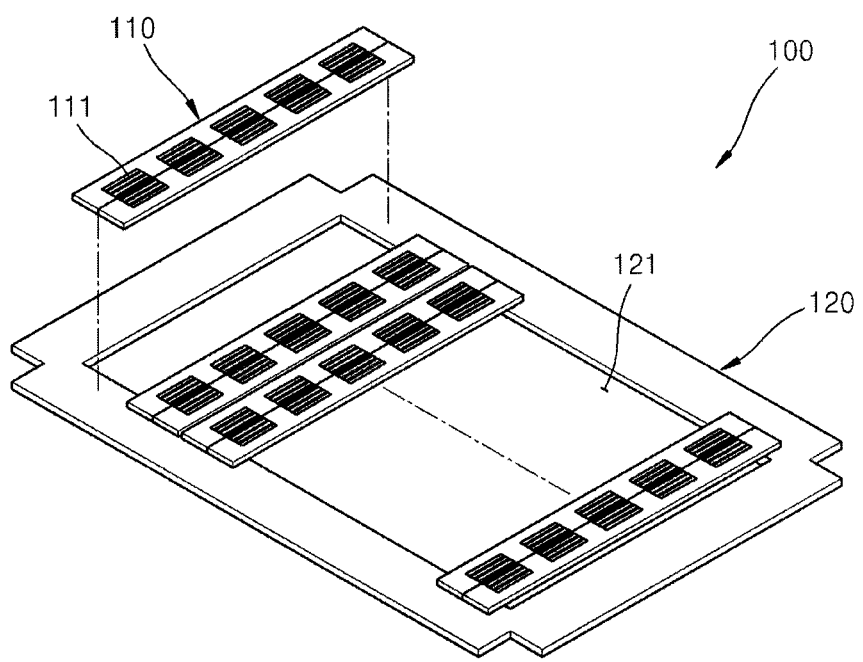
FIG. 1 is a separate perspective view of a mask frame assembly according to an embodiment of the present invention.

FIG. 1 is a separate perspective view of a mask frame assembly 100 according to an embodiment of the present invention.

Referring to FIG. 1, the mask frame assembly 10 includes a frame 120 having an opening portion 121, and a plurality of split masks 110 each of which having two end portions that are fixed to the frame 120. In FIG. 1, only four split masks 110 are illustrated to show the opening portion 121 for convenience of description, but when manufacturing is completed, the opening portion 121 is completely filled with the split masks 110.

First, the frame 120 is an outer frame of the mask frame assembly 100 and has the rectangular shape having the opening portion 121 at its center. The two end portions of each of the split masks 110 are fixed to a pair of opposite sides of the frame 120 by welding.

The split masks 110 are in the form of long sticks and each include deposition patterns 111 which are to be located within the opening portion 121, and the two end portions of each of the split masks 110 are welded to the frame 120 as described above. The split masks 110 are separately attached to the frame 120 in order to reduce etching errors as described above, instead of forming one large mask covering the opening portion 121 at once. The split masks 110 may be formed of, for example, nickel, a nickel alloy, a nickel-cobalt alloy or the like.

Figure 2A:
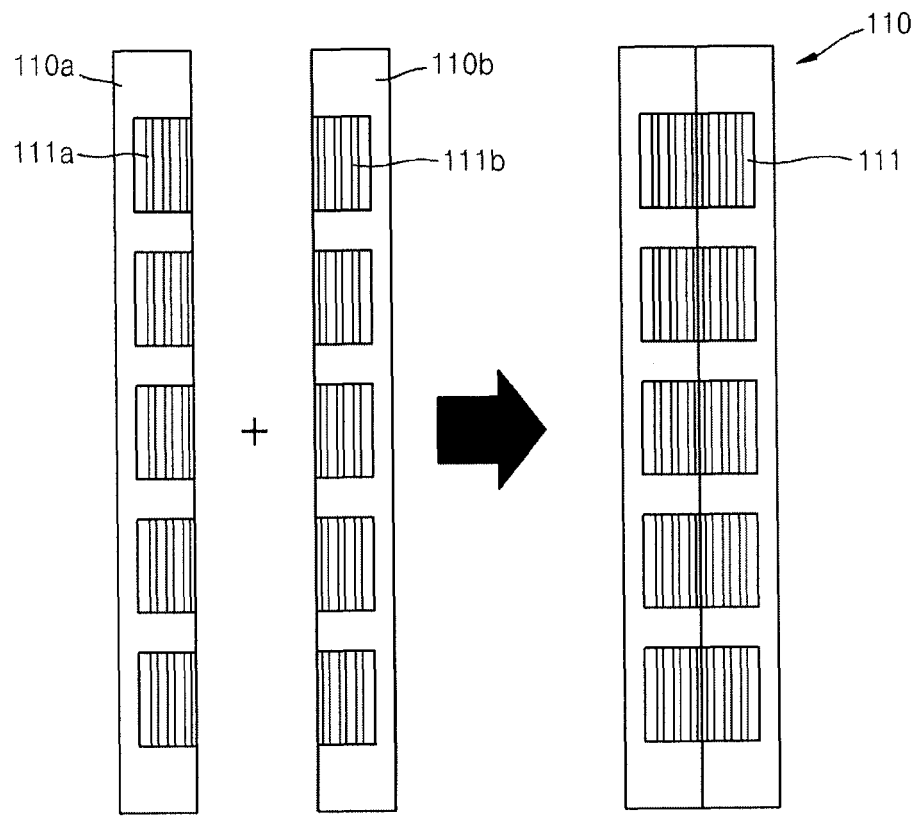
FIG. 2A is a schematic view illustrating a split mask of the mask frame assembly of FIG. 1, according to an embodiment of the present invention.

FIG. 2A is a schematic view illustrating the split masks 110 of the mask frame assembly 100 of FIG. 1, according to an embodiment of the present invention. As illustrated in FIG. 2A, the split masks 110 are not single bodies but are formed of a plurality of partial masks 110a and 110b that are coupled to each other. That is, adjacent sides of a first partial mask 110a having a first partial pattern 111a and a second partial mask 110b having a second partial pattern 111b are bonded to each other so as to form one split mask 110. The first partial pattern 111a and the second partial pattern 111b are connected to each other, thereby forming a deposition pattern 111 corresponding to a unit screen. In FIG. 2A, the two partial masks 110a and 110b form one split mask 110 but the split mask 110 may also be formed of two or more partial masks.

Figure 2B:
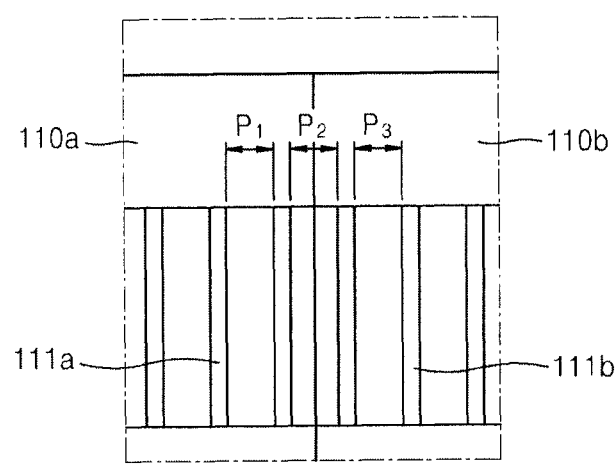
FIG. 2B is an expanded view of a concave portion of the split mask illustrated in FIG. 2A.

FIG. 2B is an expanded view of a concave portion of the split mask illustrated in FIG. 2A. Here, predetermined pattern pitches P1, P2, and P3 of the first and second partial masks 110a and 110b are formed uniformly (P1=P2=P3), but a bonding portion of the first and second partial masks 110a and 110b is included as the pattern pitch P2. That is, the pattern pitch P1 of the first partial pattern 111a constituting the deposition pattern 111 and the pattern pitch P3 of the second partial pattern 111b are the same, and the pattern pitch P2 corresponding to the bonding portion of the first and second partial masks 110a and 110b is the same as each of the pattern pitches P1 and P3. Thus, although the split mask 110 is formed by bonding the two first and second partial masks 110a and 110b to each other, the pattern pitches P1, P2, and P3 within one deposition pattern 111 are uniform overall.

When forming the split mask 110 by bonding a plurality of partial masks as the first and second partial masks 110a and 110b, the deposition pattern 111 corresponding to a large unit screen may be easily implemented. In addition, since the first and second partial patterns 111a and 111b are first formed in narrow portions of the first and second partial masks 110a and 110b by etching, etching errors, which may be generated when etching a wide member adjusted to a large screen, may be reduced.

Hereinafter, a method of manufacturing the split mask 110 by bonding the first and second partial masks 110a and 110b will be described.

FIGS. 3A through 3H are schematic views sequentially illustrating a method of manufacturing the mask frame assembly 100 illustrated in FIG. 1, according to an embodiment of the present invention. Referring to FIGS. 3A through 3H, the first and second partial masks 110a and 110b are bonded to each other using a UV-curing adhesive 301.

Figure 3A:
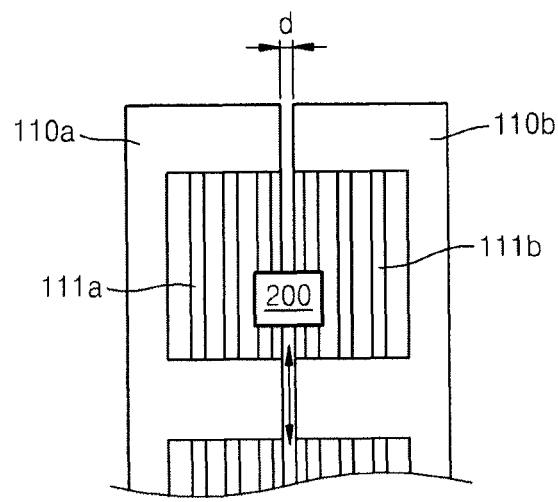
FIGS. 3A through 3H are schematic views sequentially illustrating a method of manufacturing the mask frame assembly illustrated in FIG. 1, according to an embodiment of the present invention.

First, referring to FIG. 3A, the first and second masks 110a and 110b are aligned in such a manner that their adjacent sides face each other in parallel, with a gap d of about 10 to 20 μm therebetween. Later, a portion of the UV-curing adhesive 301 soaks into the gap d.

The first and second masks 110a and 110b are aligned using a vision camera 200 as illustrated in FIG. 3A. For example, a reference pattern glass may be disposed under the first and second partial masks 110a and 110b, and the vision camera 200 may be used to observe and determine whether a reference pattern and the positions of the first and second masks 110a and 110b correspond to each other so as to align the first and second masks 110a and 110b.

Figure 3B:
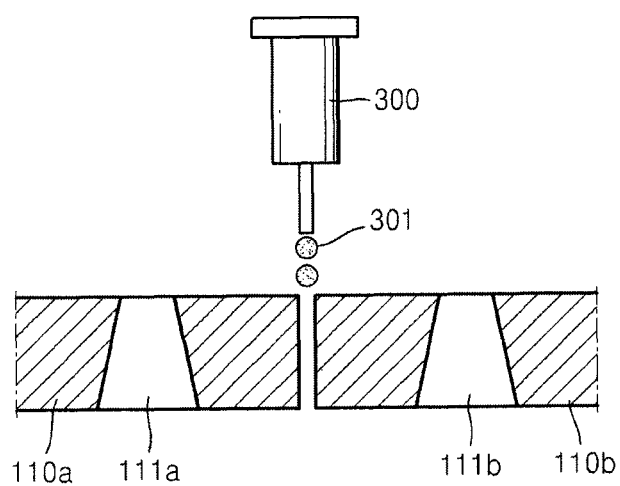

Next, when the alignment of the first and second partial masks 110a and 110b is completed, an applying apparatus 300 is started and operates as illustrated in FIG. 3B by applying UV-curing adhesive 301 to an upper surface of a bonding portion of the first and second partial masks 110a and 110b.

Figure 3C:
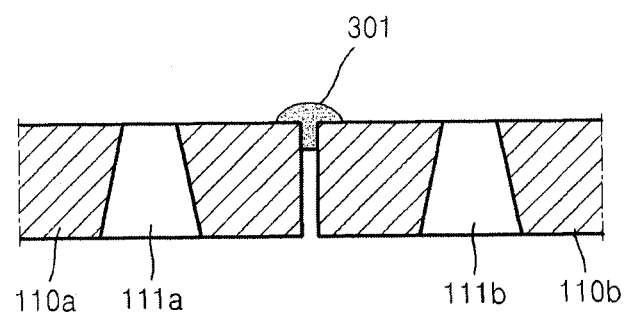
Figure 3D:
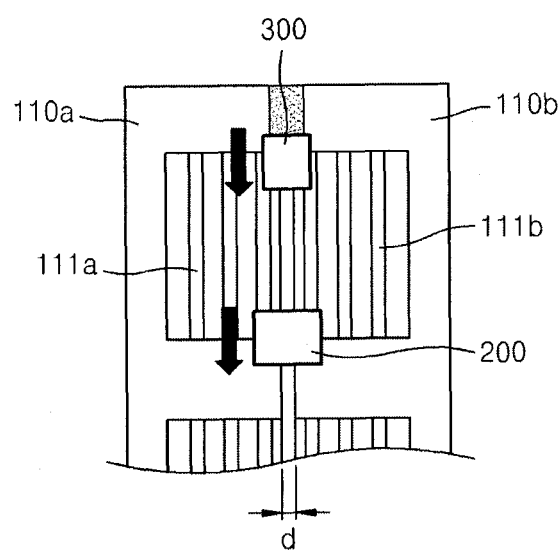

Then a portion of the UV-curing adhesive 301 soaks into the gap d as shown in FIG. 3C. When applying the UV-curing adhesive 301, the vision camera 200 may trace a line of the bonding portion to guide the applying apparatus 300, and the applying apparatus 300 may apply the adhesive to the bonding portion while following the vision camera 200.

Figure 3E:
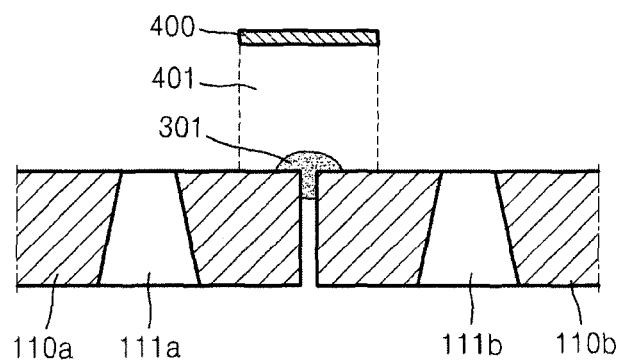

Then, in this state, when a UV ray 401 is irradiated to the bonding portion using a UV irradiation apparatus 400 as illustrated in FIG. 3E, the UV-curing adhesive 301 is cured to obtain a rigid bonding state. The UV ray 401 may be irradiated using the UV irradiation apparatus 400 onto the entire bonding portion or may be irradiated along the line of the bonding portion like the applying apparatus 300 does.

The UV-curing adhesive 301 may contain a reactive oligomer, a reactive diluent, an additive, or a photo-initiator. The reactive oligomer may contain a modified acrylic oligomer such as epoxy, polyester, or urethane. The reactive diluent may be an acrylic monomer, and examples of the additive may include an adhesive additive, a filler, an inhibitor, a thermosetting catalyst, an anaerobic catalyst, and a colorant.

After applying the upper surface of the first and second partial masks 110a and 110b with the UV-curing adhesive 301 in the above-described manner, the first and second partial masks 110a and 110b may be reversed to apply a lower surface of the first and second partial masks 110a with the UV-curing adhesive 301 and cure the same. When reversing the first and second partial masks 110a and 110b, instead of reversing just the first and second partial masks 110a and 110b, a jig (not shown) supporting the first and second partial masks 110a and 110b may also be reversed at the same time so that the previously cured UV-curing adhesive 301 does not tear off.

Figure 3F:
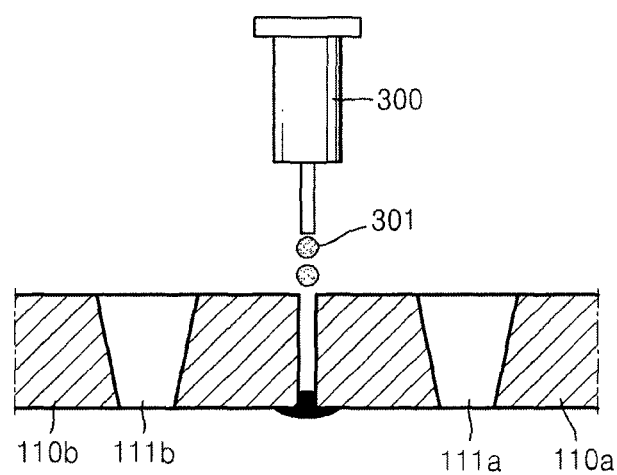
Figure 3G:
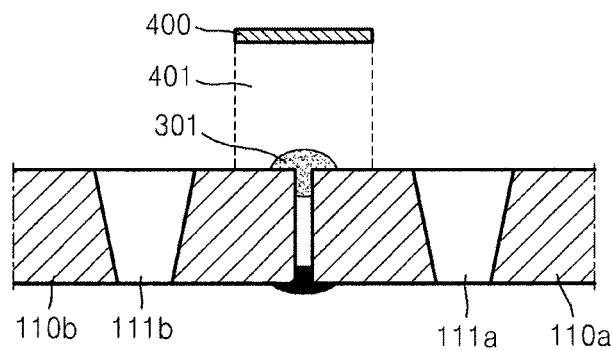

Then the lower surface of the first and second partial masks 110a and 110b is applied with the UV-curing adhesive 301 using the applying apparatus 300 as illustrated in FIG. 3F, and then a UV ray 401 is irradiated onto the lower surface of the first and second partial masks 110a and 110b by using the UV irradiation apparatus 400 as illustrated in FIG. 3G to cure the UV-curing adhesive 301.

Accordingly, the UV-curing adhesive 301 on both the upper and lower surfaces of the UV-curing adhesive 301 is cured to be in a rigid bonding state, and the split mask 110 including the deposition pattern 111 corresponding to a large unit surface screen is manufactured.

The split masks 110 manufactured in this manner are attached to the frame 120 to form the mask frame assembly 100, as described above with reference to FIG. 1.

Figure 3H:
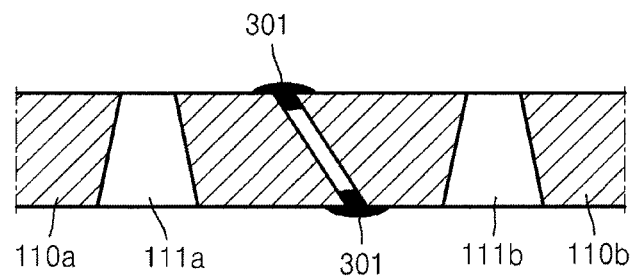

The adjacent sides of the first and second partial masks 110a and 110b may be inclined at a predetermined angle while being parallel to each other as illustrated in FIG. 3H. In this case, the split masks 110 may also be manufactured by applying and curing the UV-curing adhesive 301 on upper and lower surfaces of a bonding portion using the same process as illustrated in FIGS. 3A through 3G.

Accordingly, the split masks 110 that include the deposition pattern 111 corresponding to a large screen may be easily manufactured in the above-described operations without an increase in the amount of etching errors.

FIGS. 4A through 4H are schematic views sequentially illustrating a method of manufacturing the mask frame assembly illustrated in FIG. 1, according to another embodiment of the present invention.

Hereinafter, a method of manufacturing a split mask 110 by bonding first and second partial masks 110a and 110b by using a thermosetting adhesive 501 will be described with reference to FIGS. 4A through 4H.

Figure 4A:
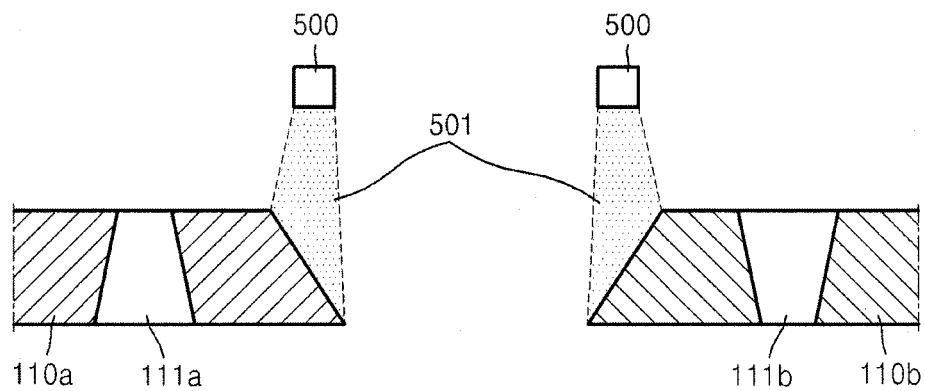
FIGS. 4A through 4H are schematic views sequentially illustrating a method of manufacturing the mask frame assembly illustrated in FIG. 1, according to another embodiment of the present invention.

First, as illustrated in FIG. 4A, a coating apparatus 500 is started and operates by coating a thermosetting adhesive 501 on sides of the first and second partial masks 110a and 110b that are to be bonded to each other.

Here, the sides of the first and second partial masks 110a and 110b which are to form a bonding portion of the first and second partial masks 110a and 110b are inclined and are parallel to each other. However, the sides of the first and second partial masks 110a and 110b may also be vertically parallel as illustrated in FIG. 3G.

Figure 4B:
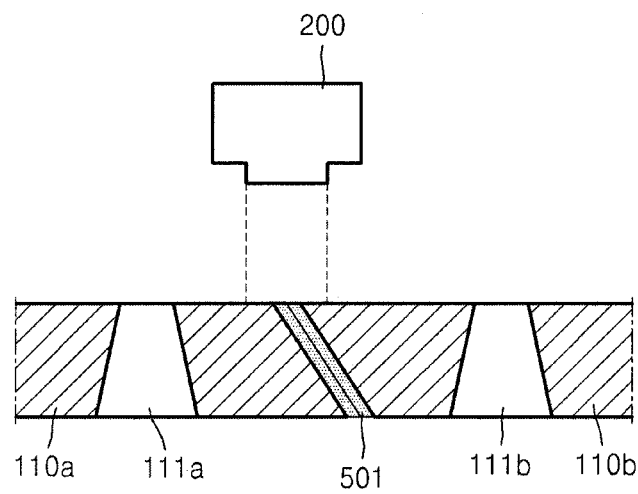

Then the sides of the first and second partial masks 110a and 110b which are each coated with the thermosetting adhesive 501 are adhered to each other as illustrated in FIG. 4B. To adhere and align the first and second partial masks 110a and 110b, a vision camera 200 may be used. For example, a reference pattern glass may be disposed under the first and second partial masks 110a and 110b to observe and determine whether positions of a reference pattern and the first and second partial masks 110a and 110b correspond to each other so as to align the first and second partial masks 110a and 110b.

Figure 4C:
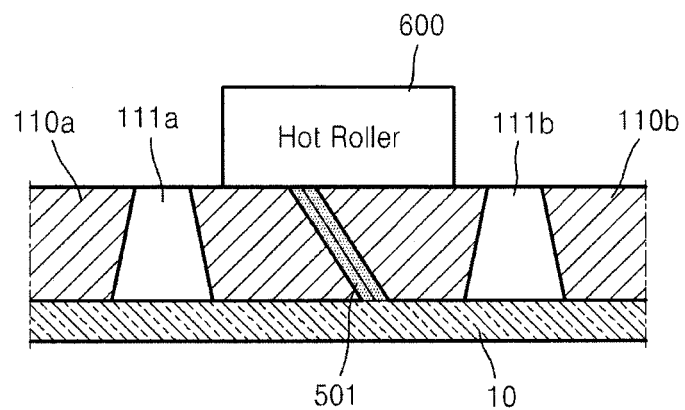

Next, as illustrated in FIG. 4C, the first and second partial masks 110a and 110b are disposed on a base plate 10 and a heat roller 600 including a heater (not shown) therein is brought in direct contact with the bonding portion to cure the thermosetting adhesive 501.

That is, as the heat roller 600 rolls along the line of the bonding portion, the thermosetting adhesive 501 is heated to thereby cure the thermosetting adhesive 501 and obtain a rigid bonding state.

Figure 4D:
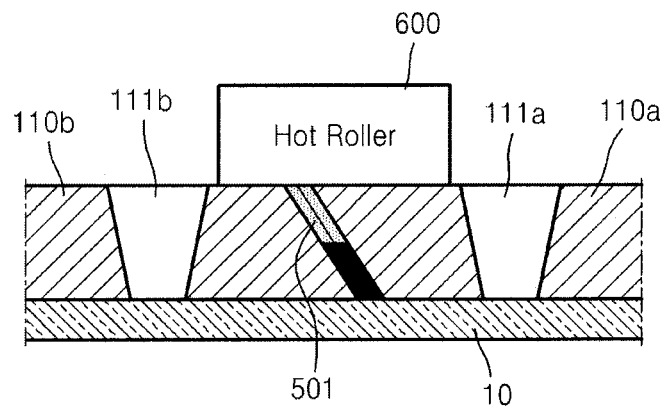

After curing the thermosetting adhesive 501 on an upper surface of the first and second partial masks 110a and 110b and spending a predetermined stabilization time in the above-described manner, the first and second partial masks 110a and 110b may be reversed and the same operation of heating and curing may be performed on a lower surface of the first and second partial masks 110a and 110b as well, as illustrated in FIG. 4D.

That is, the bonding portion on the lower surface of the first and second partial masks 110a and 110b is heated to cure the thermosetting adhesive 501.

Consequently, the thermosetting adhesive 501 coated on the sides of the bonding portion of the first and second partial masks 110a and 110b is cured so as to obtain a rigid bonding state, and thus a split mask 110 including the deposition pattern 111 corresponding to a large screen is manufactured.

Split masks 110 manufactured in this manner are attached to the frame 120 to form the mask frame assembly 100 as described above with reference to FIG. 1.

Figure 4E:
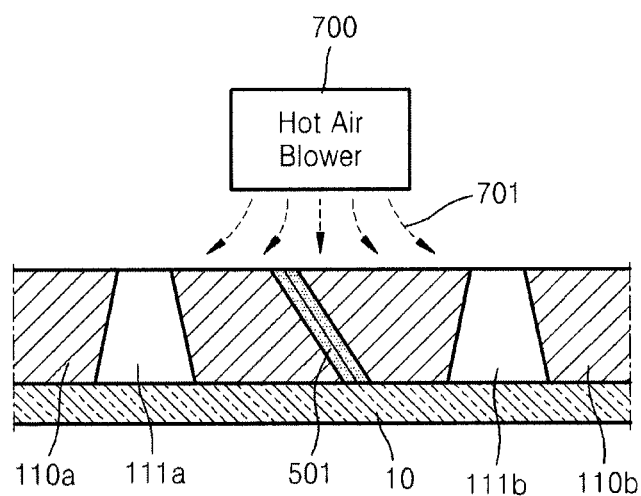
Figure 4F:
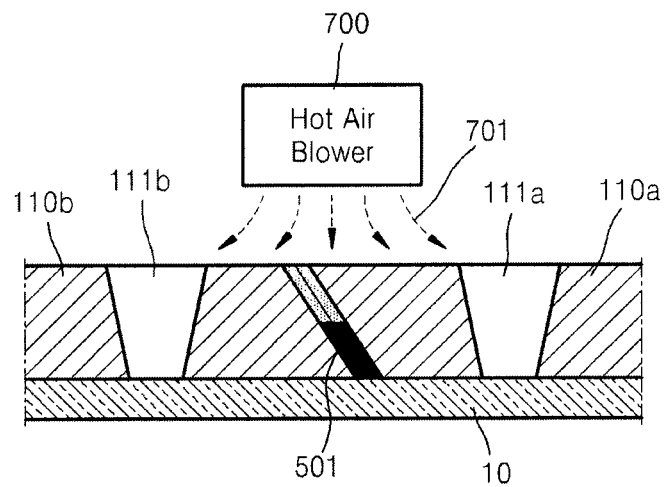

Meanwhile, while the heat roller 600 is used to heat and cure the thermosetting adhesive 501 of the bonding portion in the operations illustrated in FIGS. 4C and 4D, a blower 700 as illustrated in FIGS. 4E and 4F that blows hot air 701 to heat the thermosetting adhesive 501 without touching the bonding portion may be used instead.

That is, referring to FIG. 4E, the blower 700 is used to blow hot air 701 at the upper surface of the first and second partial masks 110a and 110b to cure an upper portion of the thermosetting adhesive 501, and then the first and second partial masks 110a and 110b are reversed to cure a lower portion of the thermosetting adhesive 501.

Accordingly, a bonded structure formed of the first and second partial masks 110a and 110b that are rigidly bonded by using the thermosetting adhesive 501, that is, the split mask 110, is formed. A plurality of the split masks 110 manufactured in this manner are attached to the frame 120 to form the mask frame assembly 100 as described above with reference to FIG. 1.

Figure 4G:
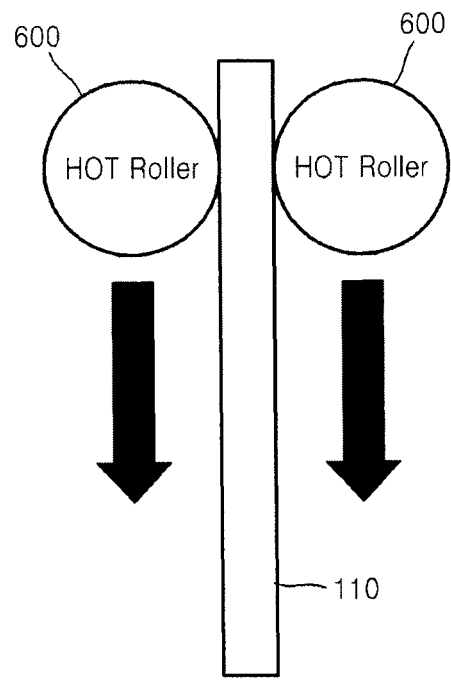
Figure 4H:
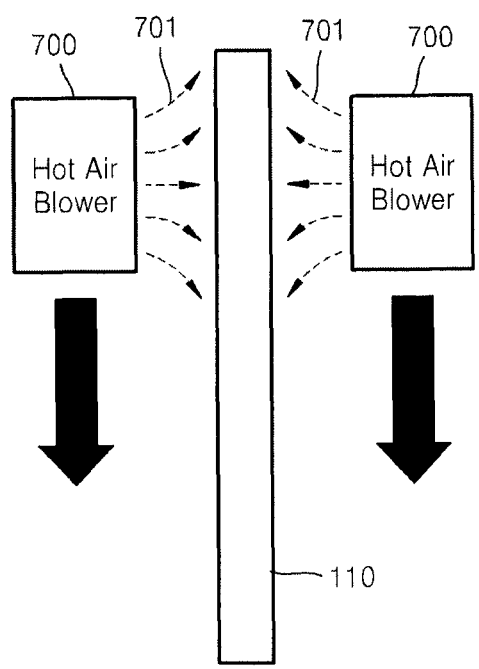

While the upper surface and the lower surface of the first and second partial masks 110a and 110b are sequentially cured in the above-described embodiment, the two surfaces may also be cured at the same time by using a plurality of heat rollers 600 or a plurality of blowers 700 as illustrated in FIG. 4G or 4H.

Accordingly, the split masks 110 that include the deposition pattern 111 corresponding to a large screen may be easily manufactured using the above-described operations without an increase in the amount of etching errors.

In addition, the mask frame assembly 100 for deposition of thin films according to the embodiments of the present invention may be used in various deposition operations such as a patterning operation of organic emissive layers.

While embodiments of the present invention have been particularly shown and described, it will be understood by those of ordinary skill in the art that various changes in form and details may be made therein without departing from the spirit and scope of the present invention as defined by the following claims.

What is claimed is:

1. A mask frame assembly for deposition of thin films, the mask frame assembly comprising:
a frame defining a window; and
multiple mask pieces arranged over the window to provide a plurality of unit masks, each unit mask being designed for a deposition pattern corresponding to a single display panel,
wherein the multiple mask pieces comprises a first mask piece and a second mask piece arranged immediately next to the first mask piece, the first mask piece comprising a first mask portion, the second mask piece comprising a second mask portion,
wherein the first mask portion of the first mask piece and the second mask portion of the second mask piece abut each other and in combination provide at least part of one of the plurality of unit masks
wherein the first mask portion comprises a first row of openings, which comprises a first opening, a second opening immediately neighboring the first opening and a first interval between the first and second openings,
wherein the second mask portion comprises a second row of openings, which comprises a third opening, a fourth opening immediately neighboring the third opening and a second interval between the third and fourth openings,
wherein the second opening and the third opening immediately neighbor each other and are separated by a third interval having a length that is substantially the same as that of the first interval.

2. The mask frame assembly of claim 1, wherein the first and second mask pieces comprises sides opposing each other and bonded to each other using an adhesive.

3. The mask frame assembly of claim 2, wherein the first mask portion and the second mask portion have a uniform pattern pitch throughout the deposition pattern including a bonding portion of the first mask piece and the second mask piece.

4. The mask frame assembly of claim 3, wherein the adhesive is an ultraviolet-curing (UV-curing) adhesive.

5. The mask frame assembly of claim 4, wherein the UV-curing adhesive is coated on upper and lower surfaces of the bonding portion.

6. The mask frame assembly of claim 5, wherein the sides of the first mask piece and the second mask piece are substantially parallel to each other.

7. The mask frame assembly of claim 3, wherein the adhesive is a thermosetting adhesive.

8. The mask frame assembly of claim 7, wherein the thermosetting adhesive is coated on sides of the bonding portion.

9. The mask frame assembly of claim 8, wherein the sides of the first mask piece and the second mask piece are substantially parallel to each other.

* * * * *